US007782665B2

(12) United States Patent
Turbanti et al.

(10) Patent No.: US 7,782,665 B2

(45) **Date of Patent: *Aug. 24, 2010**

(54) METHOD OF MANAGING A MEMORY DEVICE EMPLOYING THREE-LEVEL CELLS

(76) Inventors: Paolo Turbanti, Via Della Torre, 4, 20157 Milano (IT); Carla Giuseppina Poidomani, Via Manzoni Alessandro, 20060 Cassina de'Pecchi (IT); Emanuele Confalonieri, Via C. na Baraggia, 1, 20050 Lesmo (IT); Luigi Bettini, Via Ventiquattro Maggio, 27/D, 20040 Cavenago di Brianza (IT)

( * ) Notice: Subject to any disclaimer, the term of this patent is extended or adjusted under 35 U.S.C. 154(b) by 13 days.

This patent is subject to a terminal disclaimer.

(21) Appl. No.: 12/039,268

(22) Filed: Feb. 28, 2008

(65) Prior Publication Data

US 2008/0212369 A1 Sep. 4, 2008

(30) Foreign Application Priority Data

Mar. 2, 2007 (IT) .......................... VA2007A0026

(51) Int. Cl.
*G11C 16/04* (2006.01)

(52) U.S. Cl. .............. 365/185.03; 365/168; 365/230.06

(58) Field of Classification Search ............ 365/185.03, 365/168, 230.06

See application file for complete search history.

(56) References Cited

U.S. PATENT DOCUMENTS

| | | | | |
|---|---|---|---|---|
| 5,838,610 | A | 11/1998 | Hashimoto | |
| 5,973,958 | A | 10/1999 | Parker | |
| 6,208,542 | B1 | 3/2001 | Wang et al. | |
| 7,366,001 | B2 * | 4/2008 | Hanzawa et al. | 365/49.1 |
| 2008/0106937 | A1 | 5/2008 | Magnavacca et al. | |
| 2008/0266946 | A1 | 10/2008 | Magnavacca et al. | |

OTHER PUBLICATIONS

Notice of Allowance mailed Jul. 9, 2009, for U.S. Appl. No. 12/109,525.

Office action mailed Feb. 23, 2009, for U.S. Appl. No. 11/934,144.

Notice of Allowance mailed Jun. 17, 2009, for U.S. Appl. No. 11/934,144.

* cited by examiner

*Primary Examiner*—Huan Hoang

(74) *Attorney, Agent, or Firm*—Schwabe Williamson & Wyatt

(57) ABSTRACT

A method of managing a multi-level memory device having singularly addressable three-level cells includes storing strings of three bits by coding them in corresponding ternary strings according to a coding scheme and writing each of the ternary strings in a respective pair of three-level cells. Strings of three bits are read by reading respective ternary strings written in respective pairs of three-level cells and decoding each read ternary string in a corresponding string of three bits according to the coding scheme. A pair of adjacent bits, belonging to at least one of a same initial string and two initial adjacent strings, are programmed by identifying pairs of three-level cells to be programmed that encode the strings of three bits and programming each pair of three-level cells.

17 Claims, 3 Drawing Sheets

METHOD OF MANAGING A MEMORY DEVICE EMPLOYING THREE-LEVEL CELLS

FILED OF THE INVENTION

This invention relates to semiconductor memory devices and, in particular, to a method of managing a memory that employs three-level cells.

BACKGROUND OF THE INVENTION

In a multi-level memory device, cells generally assume more than two logic states and thus may store more than one bit of information. In a four-level memory cell, each cell is capable of storing two-bit of information by fixing its threshold voltage according to the distribution depicted in FIG. 1. The state '11' is stored by an erasing operation, and the other three states ('10', '01' and '00') are stored by a programming operation.

In order to avoid the known problems of "read disturb" and "retention," an error correction code (ECC) technique is used by reserving a number of memory cells, commonly called correction cells, the content of which is determined as a function of data stored in the cells of the array, in order to correct an eventual loss of information. For example, in NOR FLASH memory devices in which a page of data at the time, typically having 4, 8 or 16 words, is read, for each page there is a certain number k of correction cells; the larger the value of k, the larger the number of bits that can be corrected on the page.

A drawback of this approach is that the ECC limits the operations that may be executed by users. In a NOR FLASH memory device, it is possible to carry out a program operation on a single cell, but an erase operation may be executed in parallel on all the cells of a sector.

The presence of cells for storing the correction bit ECC may not allow users to carry out a program operation on each page without erasing the whole memory sector. Indeed, a program operation (1→0) may imply erasing (0→1) in at least a correction cell. As stated before, this may not be done on a single cell of a NOR FLASH memory device, but on the whole addressed sector to which the cell belongs. As a consequence, the use of ECCs in NOR FLASH memory devices may strongly limit the so-called "bit manipulation," i.e. the possibility of programming single bits of the memory.

A three-level memory device that occupies a silicon area slightly larger than that of four-level memory devices of the same storage capacity, but that practically avoids the above remarked ECC limitations, is described in the Italian patent application VA2006A000065, in the name of the same applicant.

The disclosed device employs three-level cells in which each pair of cells is to store a string of three bits and comprises a coding circuit and a decoding circuit for converting, in a write operation, the strings of three bits to be stored in strings of two ternary values to be written in respective pairs of three-level cells and vice versa during a read operation.

The possible states that may be assumed by the cells are three, thus the relative distributions of the read thresholds, as depicted in FIG. 2, may be relatively farther away from the voltage levels at which the "read disturb" and "retention" phenomena become more severe.

As may be common to all multi-level memory devices, the disclosed three-level memory device is burdened by problems that may be created by accidental supply voltage interruptions or significant voltage drops during programming operations.

In order to better understand this peculiar challenge faced by multi-level memory devices, let us refer to the scheme of FIG. 3 for a four-level cell capable of storing two bits.

Supposing that an initially erased cell (11) is to be programmed in the state 01, this operation is compliant with "bit manipulation" rules because only one bit may be programmed. The threshold voltage Vth of the cell may be incremented by applying program pulses to the cell, until its threshold is incremented to a value comprised in the distribution curve relative to the level 01.

As schematically illustrated in FIG. 3, an accidental voltage drop or supply interruption sufficient to stop the program operation may occur when the threshold voltage Vth is still within the distribution corresponding to the level 10. In this case, a transition 11→10 takes place and it may be no longer possible to further program the cell to the state 01 because the transition 10→01, even if physically possible, violates the "bit manipulation" rules and is impeded by the control circuits of the memory. Repeating the same program operation would not solve the problem, because the cell would go from state 10 to state 00.

An approach would be that of carrying out an erase operation for bringing the cell from the state 10 back to the state 11 and then repeating the program operation. This may be inconvenient, particularly in NOR FLASH memory devices, wherein erase operations may be carried out on a whole memory sector and not on a single cell. In practice, in order to comply with the "bit manipulation" requisites, a bit at logic level 1 may be programmed to the logic level 0 but the opposite cannot be done through a program operation.

For this reason, when it is of paramount importance that data be correctly stored even in the event of a power failure during program operations, adjacent pairs of bits may be programmed, that is equivalent to programming a four-level cell to the state 00. This is possible without violating the rules of "bit manipulation" because a four-level cell may be programmed in the state 00 whether it is in the state 10 or in the state 01.

In the case of a three-level cell, it may be easily recognized that an accidental power failure may be dangerous if it took place during a program operation from A to C and if the threshold voltage of the cell at the moment of the failure corresponds to the level B.

Therefore, a management method of a memory device including three-level cells may ensure that an eventual interruption of a program operation may not leave pairs of memory cells in an intermediate program state from which it would not be possible to reach the desired final state without violating the rules of "bit manipulation."

SUMMARY OF THE INVENTION

If triplets of bits are encoded in pairs of cells according to certain encoding schemes, it is possible to correctly program pairs of cells even if a power supply failure or other accidental event untimely stops the program operation.

According to an embodiment, strings of three bits are encoded in pairs of three-level cells according to the following code.

| | |
|---|---|
| 111 | AA |
| 110 | AB |
| 101 | BB |
| 011 | BA |
| 010 | AC o CA |
| 100 | BC |
| 001 | CB |
| 000 | CC |

Pairs of cells are programmed according to the following sequence:

a) programming in the state C the least significant cells that are to reach this state, b) programming in the state B the most significant cells that are to reach this state or that pass through this state, c) programming in the state B the least significant cells that are to reach this state, d) programming in the state C the most significant cells that are to reach this state.

According to an alternative embodiment, the following code is adopted:

| | |
|---|---|
| 111 | AA |
| 110 | AB |
| 101 | BB |
| 011 | BA |
| 010 | AC o CA |
| 100 | CB |
| 001 | BC |
| 000 | CC |

and the above specified operations from a) to d) are carried out by exchanging the roles of the most significant cells with the least significant cells.

It has been found that, with the above illustrated methods, a program operation can be completed correctly even in case of an accidental untimely interruption of the programming process by repeating the interrupted program operation.

The invention is defined in the annexed claims.

BRIEF DESCRIPTION OF THE DRAWINGS

The invention will be described referring to the attached drawings, wherein.

DETAILED DESCRIPTION OF THE PREFERRED EMBODIMENTS

In order to efficiently store bit strings in a three-level memory cell array, it is helpful to define a coding operation of binary strings in ternary strings that may be stored in three-level memory cells, and vice versa.

Figure 1:
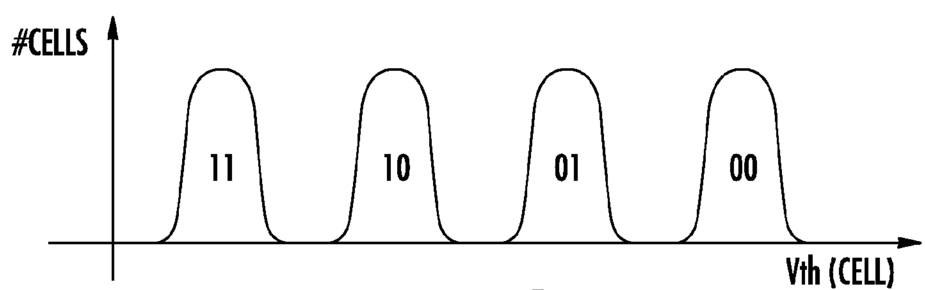
FIG. 1 depicts a distribution of threshold of memory cells that store two bits, according to the prior art.
Figure 2:
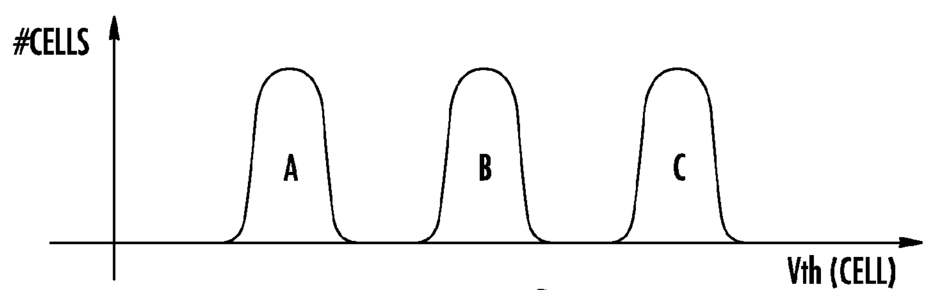
FIG. 2 depicts a sample distribution of the thresholds of a three-level cells of a memory device, according to the prior art.
Figure 3:
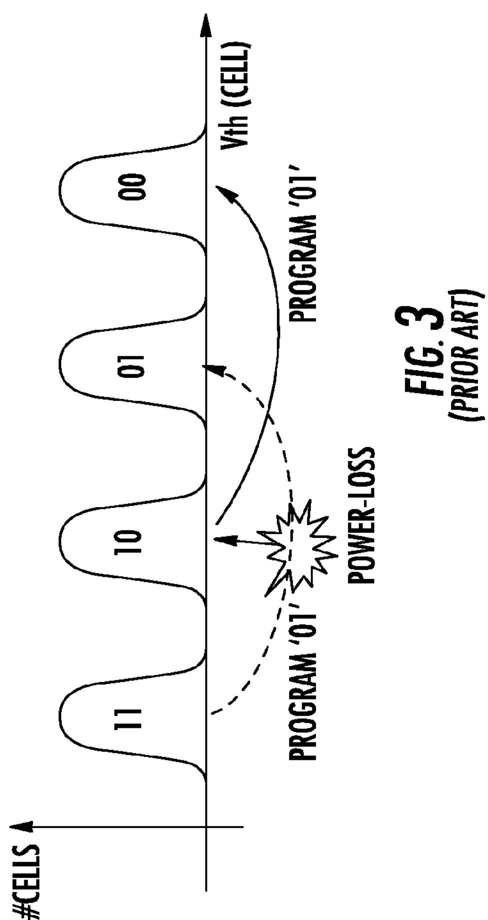
FIG. 3 illustrates schematically the effects of a supply voltage interruption during a program operation of a four-level cell, according to the prior art.
Figure 4:
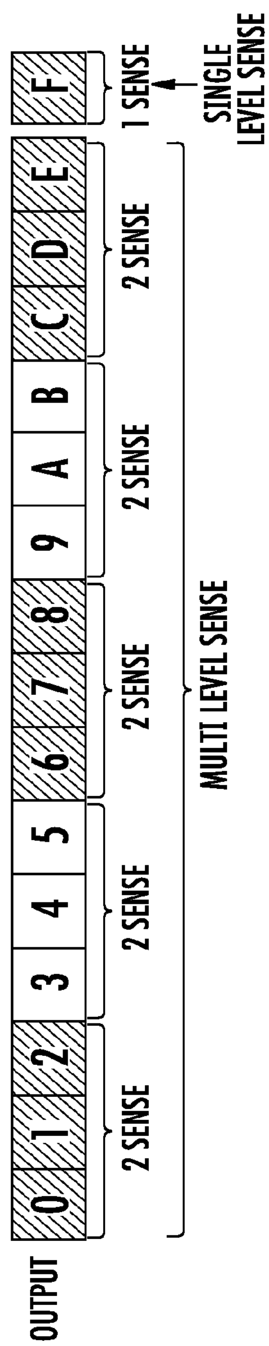
FIG. 4 depicts a sample coding of a word having 16 bits in eleven three-level-cells, in accordance with the present invention.

'A', 'B', and 'C' being the three levels, depicted in FIG. 4, that each cell may assume ('A' is the erased level, 'B' and 'C' the two programmed levels), to each pair of cells (3×3=9 possible states) the information of 3 bits ($2^3$=8 possible combinations) is associated.

Encoding nine possible pairs of levels in eight possible combinations of triplets of bits may ensure the "bit manipulation" even in the case of NOR FLASH memory devices, that is it should be possible to program each of the three bits of each string stored in a pair of three-level cells. This is possible in a three-level memory device if a programming of 1, 2 or 3 bits of the triplets corresponds to programming three-level cells and not to erasing.

Figure 5:
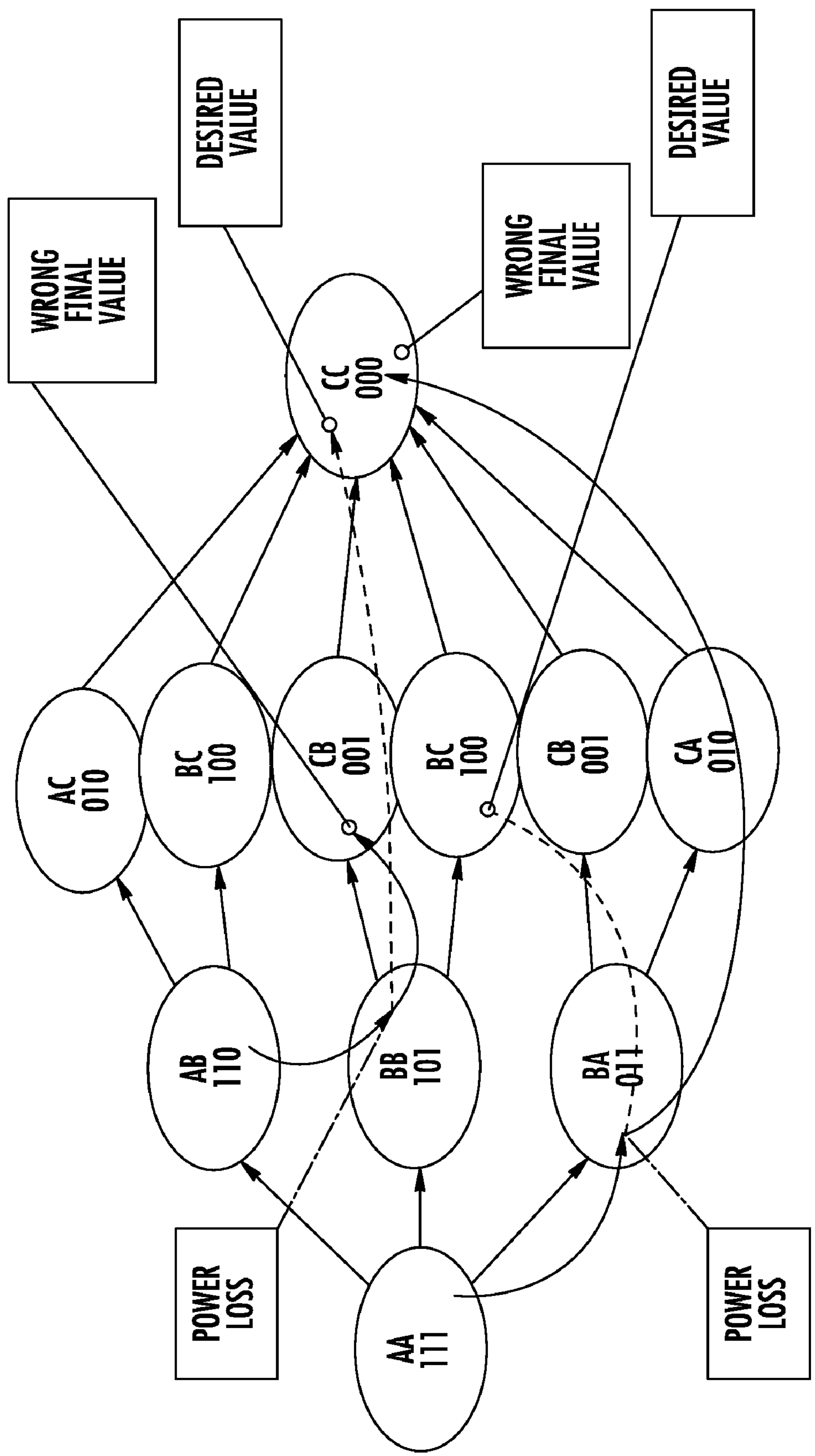
FIG. 5 depicts possible transitions of a string of two ternary symbols according to a first coding scheme of the present invention.

For sake of clarity, reference will be made to the preferred coding scheme depicted in FIG. 5, though the same observations also hold for the following alternative coding scheme:

| | |
|---|---|
| 111 | AA |
| 110 | AB |
| 101 | BB |
| 011 | BA |
| 010 | AC o CA |
| 100 | CB |
| 001 | BC |
| 000 | CC |

Using the grouping scheme of FIG. 4 of the three-level memory device, it is noticed that if two adjacent bits of a bit string are to be programmed (00) as in two-bit-per-cell memory devices, no pair of three-level cells may be programmed in the state BB, AC and CA, while all other states should be possible. Therefore, starting from a pair of erased three-level cells, that is in the state AA (111), the following cases are possible:

- if two adjacent bits to be programmed (00) belong to the same triplet of bits, then the pair of three-level cells should be programmed to one of the states BC (100) and CB (001);
- if two adjacent bits to be programmed (00) belong one to a triplet of bits and the other to another triplet of bits adjacent to the first one, then the pair of three-level cells should be programmed to one of the states AB (110) and BA (011).

Starting from a pair of three-level cells in the state AB (110) or BA (011), if the two adjacent bits to be programmed (00) belong to the same triplet of bits, then the pair of three-level cells should be programmed in the state CC (000). Evidently, starting from the states BC or CB, the pair of three-level cells can be programmed only in the state CC.

Problems due to accidentally untimely interruption of a program operation arise if between the initial and final states of the pairs to be programmed, there is at least an intermediate state, in which the program operation can unduly stop. Recalling that a program operation of two adjacent bits (00) does not reach the states BB, AC and CA for the above explained reasons, the program operations that contemplate transitions through an intermediate state are:

1) the program operations from a state AA, AB, or BA, in the state CC;

2) the program operations from the state AA either in the states CB or BC.

Even if an accidental interruption takes place, the operation mentioned at point 1) may be completed correctly simply by repeating the interrupted program steps until the state CC is reached. By contrast, the operation mentioned at point 2) may not be completed correctly if an interruption takes place while the pair of three-level cells is being programmed, if the three-level memory device is not properly managed.

Consider for example the program operation AA→CB. Both cells receive in parallel program pulses for reaching the state BB. Once the state BB has been reached, the less significant cell is deselected and program pulses are supplied to the most significant cell until it reaches the state CB. It may happen, though, that the most significant cell goes to the state B before the least significant cell and, if in such a situation an accidental interruption (e.g. a supply voltage interruption or severe drop) occurs, the program operation would be stopped with the pair of three-level cells in the state BA. From this state it may not be possible to go to the state CB without violating the rules of "bit manipulation." The above exposed difficulty is also encountered, when programming from the state AA to the state BC.

According to the method, to obviate to these drawbacks, the program operations mentioned at point 2) are executed by:

a) programming to the state C the least significant cells that are to reach this state, b) programming to the state B the most significant cells that are to reach this state or that must pass through this state, c) programming to the state B the least significant cells that are to reach this state, d) programming to the state C the most significant cells that are to reach this state.

In practice, the transition AA→CB is carried out through the following program operations:

a) AA→AA;

b) AA→BA;

c) BA→BB;

d) BB→CB.

Another alternative valid coding scheme that can be adopted for solving the above described drawbacks is the following:

| | |
|---|---|
| 111 | AA |
| 110 | AB |
| 101 | BB |
| 011 | BA |
| 010 | AC o CA |
| 100 | CB |
| 001 | BC |
| 000 | CC |

and the sequence of operations to be carried out for programming a pair of cells may be:

a) programming to the state C the most significant cells that are to reach this state, b) programming to the state B the least significant cells that are to reach this state or that must pass through this state, c) programming to the state B the most significant cells that are to reach this state B, d) programming to the state C the least significant cells that are to reach this state.

With the methods of this approach, difficulties due to eventual voltage interruptions (or due to any cause) of programming operation are overcome because the programming operations take place by changing a single level of the state of a single cell and the programming step d) may be correctly completed even if the arresting event takes place when the pairs of cells is in the intermediate state BB. Indeed, starting from the state BB it is possible to reach the state CB (BC) by changing of a single level the state of a single cell.

According to the managing method of the memory device employing three-level cells, it is no longer helpful to implement an ECC technique for completing any program operation in case of an accidental untimely interruption of the process without violating the "bit manipulation" rules.

That which is claimed:

1. A method of managing a multi-level memory device that includes singularly addressable three-level cells, the method comprising:

storing strings of three bits by coding them in corresponding ternary strings according to a coding scheme and writing each of the ternary strings in a respective pair of three-level cells;

programming a pair of adjacent bits, belonging to at least one of a same string and two adjacent strings, by identifying pairs of three-level cells to be programmed that encode the strings of three bits and programming each pair of three-level cells by at least determining whether a least significant cell of a pair of three-level cells is to be programmed in a state corresponding to a highest program level, and, if so, programming the least significant cell in the state corresponding to the highest program level, determining whether a most significant cell of the pair of three-level cells is to be programmed in a state corresponding to either an intermediate program level or the highest program level, and, if so, programming the most significant cell in the state corresponding to the intermediate program level, determining whether the least significant cell of the pair of three-level cells is to be programmed in a state corresponding to the intermediate program level, and, if so, programming the least significant cell in the state corresponding to the intermediate program level, and determining whether the most significant cell of the pair of three-level cells is to be programmed in a state corresponding to the highest program level, and, if so, programming the most significant cell in the state corresponding to the highest program level.

2. The method of claim 1 wherein the coding scheme comprises

| | |
|---|---|
| 111 | AA |
| 110 | AB |
| 101 | BB |
| 011 | BA |
| 010 | AC or CA |
| 100 | BC |
| 001 | CB |
| 000 | CC |

and wherein the highest program level corresponds to C, the intermediate program level corresponds to B, and the lowest program level corresponds to A.

3. The method of claim 1 wherein programming the pair of three-level cells is performed by delivering program pulses to the pair of three-level cells.

4. A method of managing a multi-level memory device that includes singularly addressable three-level cells, the method comprising:

storing strings of three bits by coding them in corresponding ternary strings according to a coding scheme and writing each of the ternary strings in a respective pair of three-level cells;

programming a pair of adjacent bits, belonging to at least one of a same string and two adjacent strings, by identifying pairs of three-level cells to be programmed that encode the strings of three bits and programming each pair of three-level cells by at least determining whether a most significant cell of the pair of three-level cells is to be programmed in a state corresponding to a highest program level, and, if so, programming the most significant cell in the state corresponding to the highest program level, determining whether a least significant cell of the pair of three-level cells is to be programmed in a state corresponding to either an intermediate program level or the highest program level, and, if so, programming the least significant cell in the state corresponding to the intermediate program level, determining whether the most significant cell of the pair of three-level cells is to be programmed in a state corresponding to the intermediate program level, and, if so, programming the most significant cell in the state corresponding to the intermediate program level, and determining whether the least significant cell of a pair of three-level cells is to be programmed in a state corresponding to the highest program level, and, if so, programming the least significant cell in the state corresponding to the highest program level.

5. The method of claim 4 wherein the coding scheme comprises

| | |
|---|---|
| 111 | AA |
| 110 | AB |
| 101 | BB |
| 011 | BA |
| 010 | AC or CA |
| 100 | CB |
| 001 | BC |
| 000 | CC |

and wherein the highest program level corresponds to C, the intermediate program level corresponds to B, and the lowest program level corresponds to A.

6. The method of claim 4 wherein programming the pair of three-level cells is performed by delivering program pulses to the pair of three-level cells.

7. A memory device comprising:

a plurality of three-level memory cells being singularly addressable;

circuitry to store strings of three bits by coding them in corresponding ternary strings according to a coding scheme and to write each of the ternary strings in a respective pair of three-level memory cells;

circuitry to program a pair of adjacent bits, belonging to at least one of a same string and two adjacent strings, by identifying pairs of three-level memory cells to be programmed that encode the strings of three bits and programming each pair of three-level memory cells by determining whether a least significant cell of a pair of three-level memory cells is to be programmed in a state corresponding to a highest program level, and, if so, programming the least significant cell in the state corresponding to the highest program level, determining whether a most significant cell of the pair of three-level memory cells is to be programmed in a state corresponding to either an intermediate program level or the highest program level, and, if so, programming the most significant cell in the state corresponding to the intermediate program level, determining whether the least significant cell of the pair of three-level memory cells is to be programmed in a state corresponding to the intermediate program level, and, if so, programming the least significant cell in the state corresponding to the intermediate program level, and determining whether the most significant cell of the pair of three-level memory cells is to be programmed in a state corresponding to the highest program level, and, if so, programming the most significant cell in the state corresponding to the highest program level.

8. The memory device of claim 7 wherein the coding scheme comprises

| | |
|---|---|
| 111 | AA |
| 110 | AB |
| 101 | BB |
| 011 | BA |
| 010 | AC or CA |
| 100 | BC |
| 001 | CB |
| 000 | CC |

and wherein the highest program level corresponds to C, the intermediate program level corresponds to B, and the lowest program level corresponds to A.

9. The memory device of claim 7 wherein the circuitry to write each of the ternary strings in a respective pair of three-level memory cells delivers program pulses to the pair of three-level memory cells.

10. A method comprising:

determining that a first cell of a pair of three-level cells is to be programmed to a highest programming level to represent a first ternary value of a ternary string;

determining that a second cell of the pair is to be programmed to an intermediate programming level to represent a second ternary value of the ternary string;

programming the first cell to the intermediate programming level;

programming, subsequent to said programming of the first cell to the intermediate programming level, the second cell to the intermediate programming level; and programming, subsequent to said programming of the second cell to the intermediate programming level, the first cell to the highest programming level.

11. The method of claim 10, further comprising coding a three-bit sequence into the ternary string according to a coding scheme that includes

| Three bit sequence | First ternary value | Second ternary value |
|---|---|---|
| 111 | A | A |
| 110 | A | B |
| 101 | B | B |
| 011 | B | A |
| 010 | A, C | C, A |
| 100 | B | C |
| 001 | C | B |
| 000 | C | C |

wherein the highest program level corresponds to C, the intermediate program level corresponds to B, and a lowest program level corresponds to A.

12. The method of claim 10, further comprising coding a three-bit sequence into the ternary string according to a coding scheme that includes

| Three bit sequence | First ternary value | Second ternary value |
|---|---|---|
| 111 | A | A |
| 110 | B | A |
| 101 | B | B |
| 011 | A | B |
| 010 | C, A | A, C |
| 100 | B | C |
| 001 | C | B |
| 000 | C | C |

wherein the highest program level corresponds to C, the intermediate program level corresponds to B, and a lowest program level corresponds to A.

13. The method of claim 10, further comprising:

coding three-bit sequences into respective ternary strings;

determining said coding of the three-bit sequences includes updating at least a pair of adjacent bits;

determining that a first cell is to be programmed to the highest programming level to represent a first ternary value of the ternary string that represents at least one of the pair of adjacent bits; and wherein said programming the first cell to the intermediate programming level, said programming the second cell to the intermediate programming level, and said programming the first cell to the highest programming is based at least in part on said determining that the coding includes updating at least the pair of adjacent bits.

14. A memory device comprising:

a plurality of three-level memory cells being singularly addressable;

circuitry to determine that a first cell of a pair of three-level cells is to be programmed to a highest programming level to represent a first ternary value of a ternary string;

circuitry to determine that a second cell of the pair of three-level cells is to be programmed to an intermediate programming level to represent a second ternary value of the ternary string;

circuitry to program the first cell to the intermediate programming level;

circuitry to program, subsequent to said programming of the first cell to the intermediate programming level, the second cell to the intermediate programming level; and circuitry to program, subsequent to said programming of the second cell to the intermediate programming level, the first cell to the highest programming level.

15. The memory device of claim 14, further comprising circuitry for coding a three-bit sequence into the ternary string according to a coding scheme that includes

| Three bit sequence | First ternary value | Second ternary value |
|---|---|---|
| 111 | A | A |
| 110 | A | B |
| 101 | B | B |
| 011 | B | A |
| 010 | A, C | C, A |
| 100 | B | C |
| 001 | C | B |
| 000 | C | C |

and wherein the highest program level corresponds to C, the intermediate program level corresponds to B, and a lowest program level corresponds to A.

16. The memory device of claim 14, further comprising circuitry for coding a three-bit sequence into the ternary string according to a coding scheme that includes

| Three bit sequence | First ternary value | Second ternary value |
|---|---|---|
| 111 | A | A |
| 110 | B | A |
| 101 | B | B |
| 011 | A | B |
| 010 | C, A | A, C |
| 100 | B | C |
| 001 | C | B |
| 000 | C | C |

and wherein the highest program level corresponds to C, the intermediate program level corresponds to B, and a lowest program level corresponds to A.

17. The memory device of claim 14, further comprising:

circuitry to code three-bit sequences into respective ternary strings;

circuitry to determine said coding of the three-bit sequences includes updating at least a pair of adjacent bits;

circuitry to determine that a first cell is to be programmed to the highest programming level to represent a first ternary value of the ternary string that represents at least one of the pair of adjacent bits; and wherein said programming the first cell to the intermediate programming level, said programming the second cell to the intermediate programming level, and said programming the first cell to the highest programming is based at least in part on said determining that the coding includes updating at least the pair of adjacent bits.

* * * * *